US012207388B2

(12) United States Patent
Chen et al.

(10) Patent No.: US 12,207,388 B2
(45) Date of Patent: Jan. 21, 2025

(54) FASTENING SYSTEM FOR COUPLING A COMPUTING MODULE TO A PRINTED CIRCUIT BOARD

(71) Applicant: Dell Products L.P., Round Rock, TX (US)

(72) Inventors: Tung-Yi Chen, New Taipei (TW); Kang-Wei Fan, Taoyuan (TW); Jing-Tang Wu, New Taipei (TW)

(73) Assignee: Dell Products L.P., Round Rock, TX (US)

( * ) Notice: Subject to any disclaimer, the term of this patent is extended or adjusted under 35 U.S.C. 154(b) by 194 days.

(21) Appl. No.: 18/164,751

(22) Filed: Feb. 6, 2023

(65) Prior Publication Data

US 2024/0268016 A1 Aug. 8, 2024

(51) Int. Cl.
*H05K 1/02* (2006.01)
*H05K 1/18* (2006.01)

(52) U.S. Cl.
CPC .......... *H05K 1/0201* (2013.01); *H05K 1/181* (2013.01)

(58) Field of Classification Search
CPC ........ H05K 1/0201; H05K 1/181; H05K 7/20; H01L 23/4006
See application file for complete search history.

(56) References Cited

U.S. PATENT DOCUMENTS

| 2004/0009052 A1* | 1/2004 | Jungman | F16B 43/00 411/368 |
| 2019/0304869 A1* | 10/2019 | Larson | H01L 23/4093 |
| 2020/0101570 A1* | 4/2020 | Potter | G06F 1/203 |
| 2023/0129211 A1* | 4/2023 | Twiss | H05K 13/0882 361/709 |
| 2024/0121932 A1* | 4/2024 | Twiss | H01L 23/4006 |

* cited by examiner

*Primary Examiner* — Sherman Ng
(74) *Attorney, Agent, or Firm* — McDermott Will & Emery LLP

(57) ABSTRACT

A fastening system, including: a fastener including: a hollow shaft; a threaded portion positioned on an outer surface of the hollow shaft; a first protrusion extending from an inner surface of the hollow shaft, the first protrusion including: a first angled surface; a first engagement surface; a nut corresponding to the fastener, including: a cavity having threaded portion; a projection positioned within the cavity of the nut, the projection including: a first locking feature positioned on an outer surface of the projection, the first locking feature including: a second angled surface; a first locking surface; wherein, in a first state of engagement of the fastener with the nut, the first angled surface of the first protrusion of the fastener engages with the second angled surface of the first locking feature of the projection to rotate the fastener with respect to the nut in response to downward force on the fastener.

20 Claims, 17 Drawing Sheets

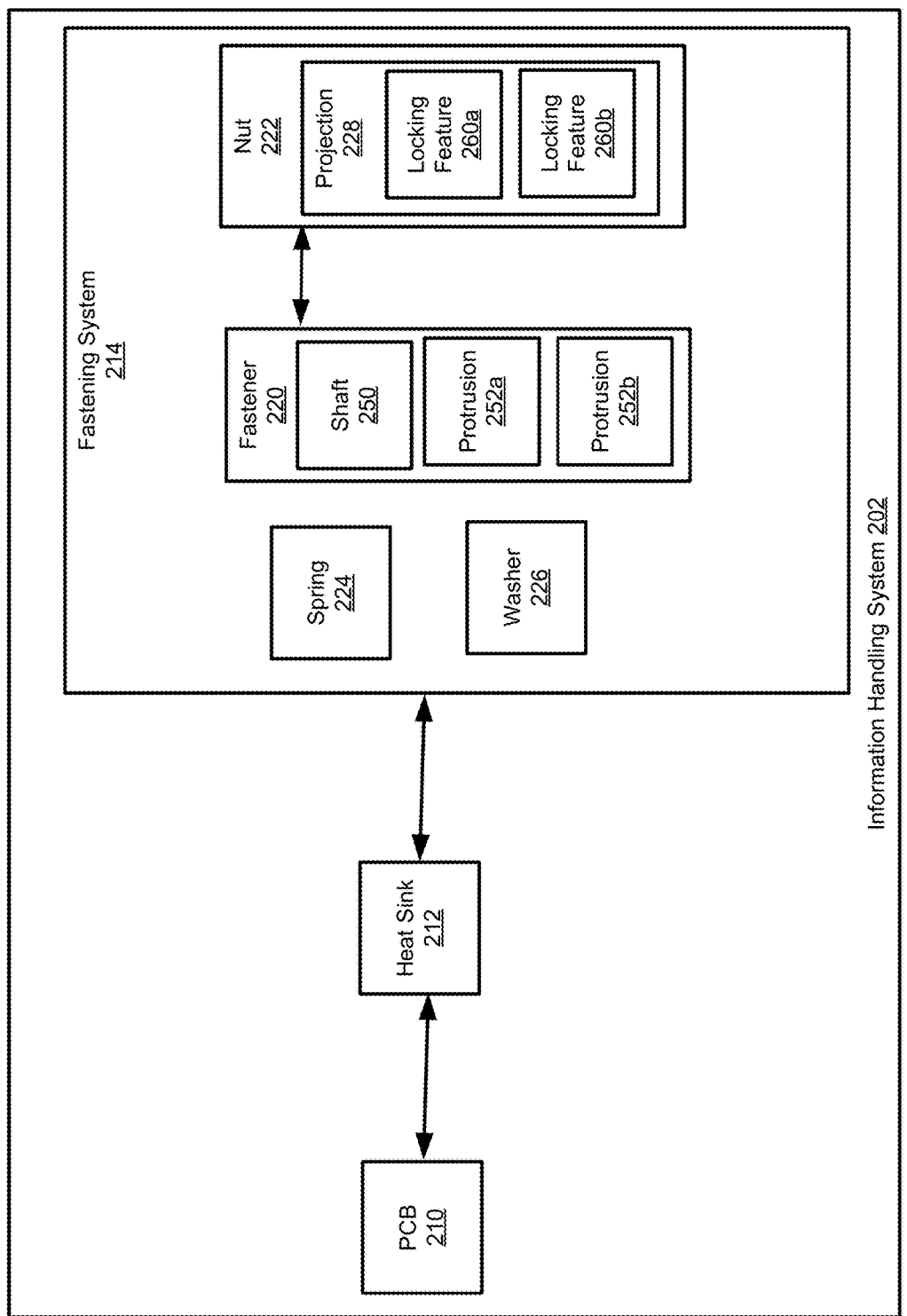
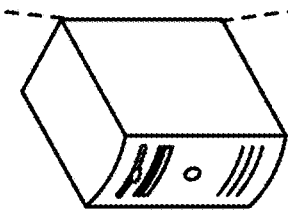
FIG. 2

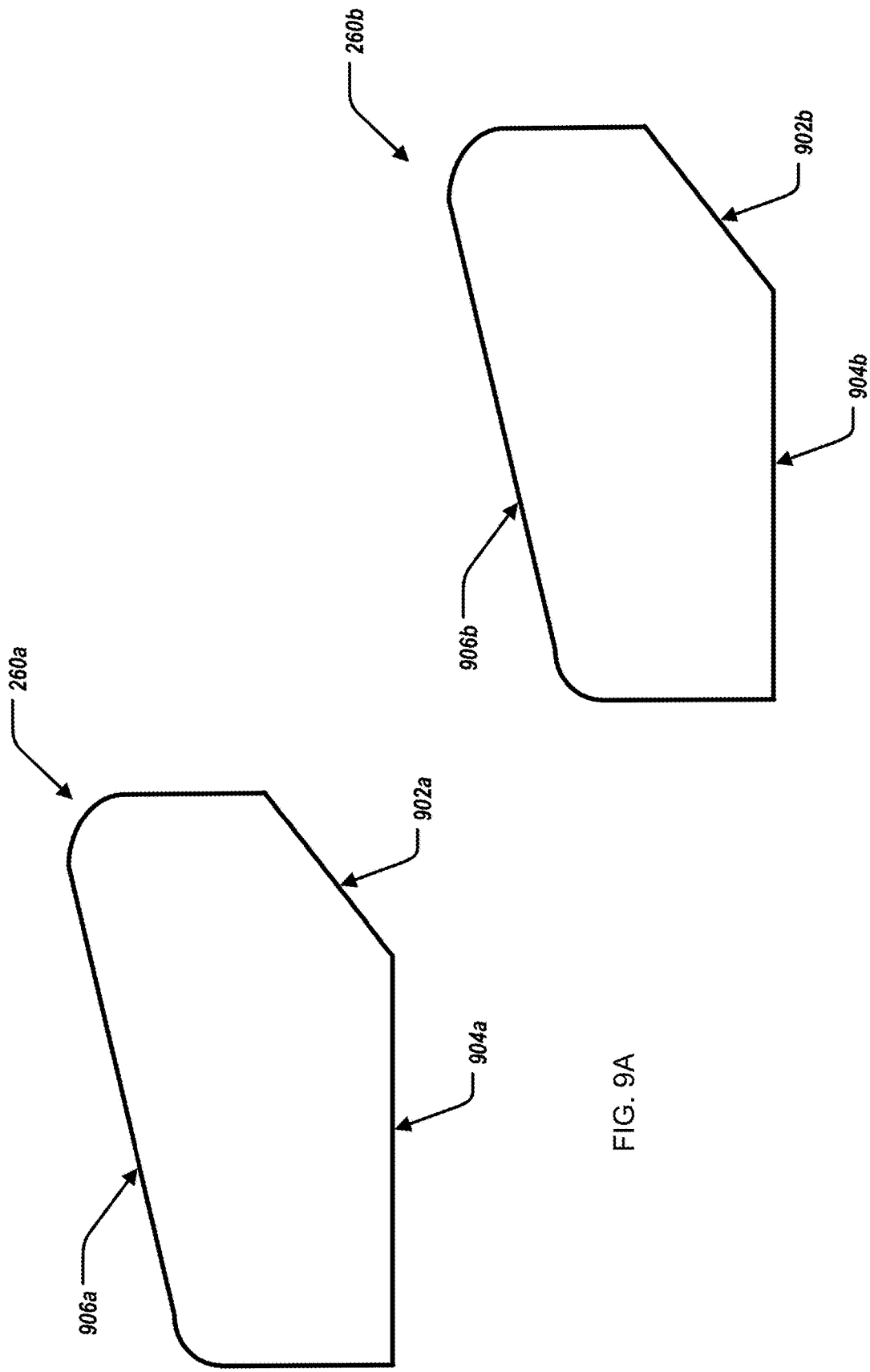

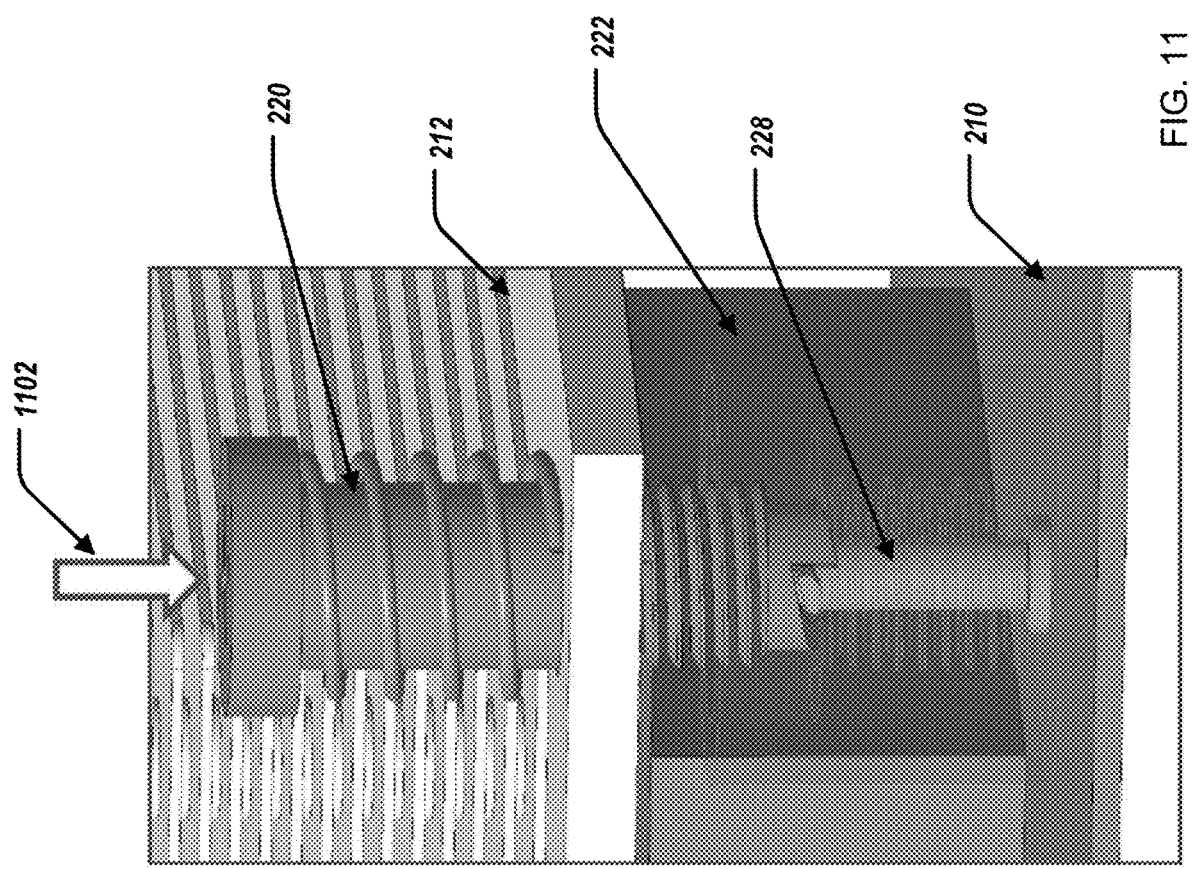

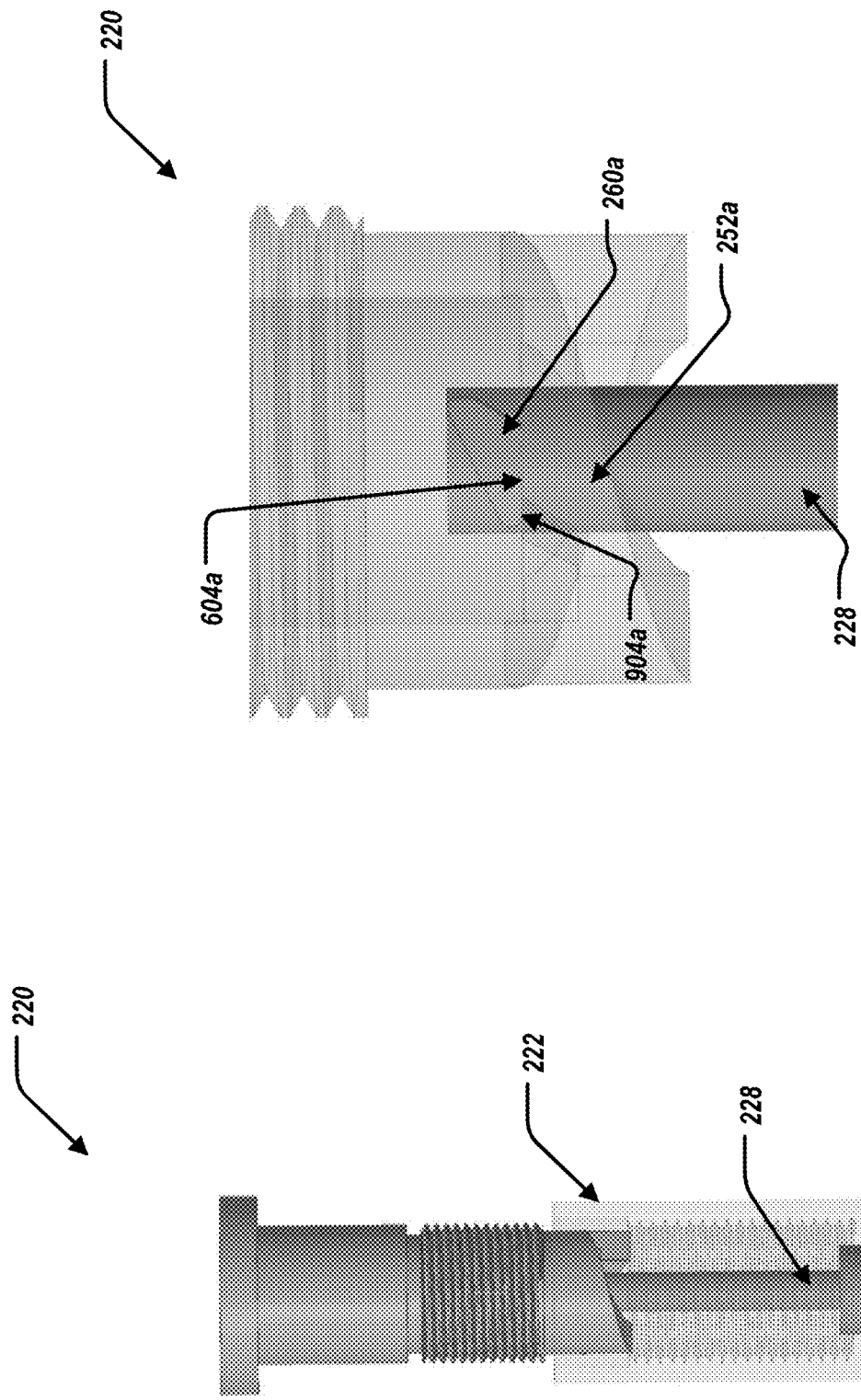

FASTENING SYSTEM FOR COUPLING A COMPUTING MODULE TO A PRINTED CIRCUIT BOARD

BACKGROUND

Field of the Disclosure

The disclosure relates generally to a fastening system for coupling a computing module to a printed circuit board of an information handling system.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

The size of heatsinks of information handling systems continues to grow due to the power increases in CPU chipset. Often time, during heatsink installation process, heatsinks can tilt slightly when tightening the screw coupling the heatsink to a PCB. This causes heatsink to have imbalance force acting on the CPU chipset.

SUMMARY

Innovative aspects of the subject matter described in this specification may be embodied in a fastening system, including: a fastener including: a hollow shaft; a threaded portion positioned on an outer surface of the hollow shaft; a first protrusion extending from an inner surface of the hollow shaft, the first protrusion including: a first angled surface; and a first engagement surface; a nut corresponding to the fastener, including: a cavity having a threaded portion; a projection positioned within the cavity of the nut, the projection including: a first locking feature positioned on an outer surface of the projection, the first locking feature including: a second angled surface; and a first locking surface; wherein, in a first state of engagement of the fastener with the nut, the first angled surface of the first protrusion of the fastener engages with the second angled surface of the first locking feature of the projection to rotate the fastener with respect to the nut in response to a downward force on the fastener, and wherein in a second state of engagement of the fastener with the nut, a portion of the first engagement surface of the first protrusion is engaged with the first locking surface of the first locking feature to maintain a positioning of the fastener with respect to the nut.

Other embodiments of these aspects include corresponding systems and apparatus.

These and other embodiments may each optionally include one or more of the following features. For instance, the projection further including: a second locking feature positioned on the outer surface of the projection, the second locking feature including: a third angled surface; and a second locking surface. The fastener further including: a second protrusion positioned on the inner surface of the hollow shaft, the second protrusion including: a fourth angled surface; and a second engagement surface. Wherein, in the first state of engagement of the fastener with the nut, the fourth angled surface of the second protrusion of the fastener engages with the third angled surface of the second locking feature to rotate the fastener with respect to the nut in response to a downward force on the fastener, wherein in the second state of engagement of the fastener with the nut, a portion of the second engagement surface of the second protrusion is engaged with the second locking surface of the second locking feature to maintain the positioning of the fastener with respect to the nut. The fastener further includes a first sloped surface and a second sloped surface at a first end of the fastener. The first locking feature further includes a fifth angled surface and the second locking feature further includes a sixth angled surface. Wherein, in the first state of engagement of the fastener with the nut, the fifth angled surface of the first locking feature engages with the second sloped surface of the fastener to rotate the fastener with respect to the nut in response to the downward force on the fastener, wherein, in the first state of engagement of the fastener with the nut, the sixth angled surface of the second locking feature engages with the first sloped surface of the fastener to rotate the fastener with respect to the nut in response to the downward force on the fastener. A first slope of the first angled surface corresponds to a second slope of the second angled surface. The first slope is complementary to the second slope. Further including a spring and a washer. The fastener is positioned through a through hole of a computing module such that the spring is positioned between a first surface of the computing module and a head of the fastener and the washer is positioned between a second surface of the computing module and the nut, the first surface of the computing module plate opposite to the second surface of the computing module. The nut is coupled to a printed circuit board (PCB). When the fastening system is in the second state of engagement of the fastener with the nut, the fastening system couples the computing module to the PCB. The computing module is a heat sink. The spring exerts a force against the head of the fastener such that the portion of the first engagement surface is engaged with the second locking surface of the second locking feature to maintain the positioning of the fastener with respect to the nut.

The details of one or more embodiments of the subject matter described in this specification are set forth in the accompanying drawings and the description below. Other potential features, aspects, and advantages of the subject matter will become apparent from the description, the drawings, and the claims.

BRIEF DESCRIPTION OF DRAWINGS

FIG. 2 illustrates a block diagram of an information handling system, including a fastening system.

FIGS. 9A, 9B illustrate respective locking features of the nut.

FIG. 11 illustrates a perspective view of the fastener coupling the heat sink to the printed circuit board by engagement with the nut, in a first state.

FIG. 14A illustrates a side view of the second state of engagement of the fastener with respect to the nut.

FIG. 14B illustrates a side view of the second state of engagement of the fastener with respect to the projection

DESCRIPTION OF PARTICULAR EMBODIMENT(S)

Figure 1:
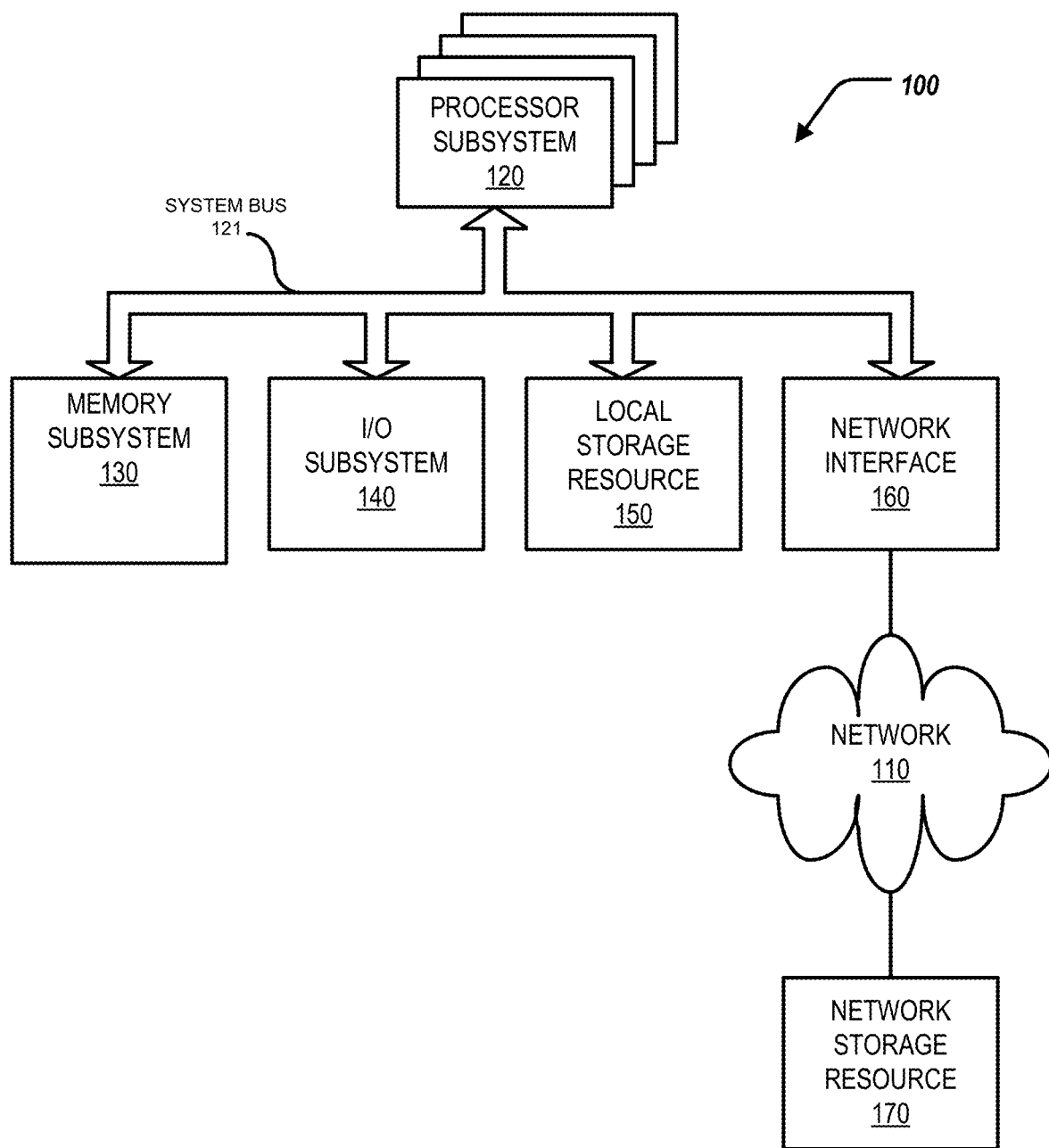
FIG. 1 is a block diagram of selected elements of an embodiment of an information handling system.

This disclosure discusses a fastening system for coupling a computing module to a printed circuit board of an information handling system. In short, a "self-locking" fastening apparatus can facilitate coupling of a computing module such as a heat sink to a printed circuit board of the information handling system. This "self-locking" fastening apparatus can minimize and/or prevent thermal module unbalance at the computing module, and minimize and/or prevent mis-alignment of the computing module with the printed circuit board.

Specifically, this disclosure discusses a fastening system, including a fastener including: a hollow shaft; a threaded portion positioned on an outer surface of the hollow shaft; a first protrusion extending from an inner surface of the hollow shaft, the first protrusion including: a first angled surface; and a first engagement surface; a nut corresponding to the fastener, including: a cavity having a threaded portion; and a projection positioned within the cavity of the nut, the projection including: a first locking feature positioned on an outer surface of the projection, the first locking feature including: a second angled surface; and a first locking surface; wherein, in a first state of engagement of the fastener with the nut, the first angled surface of the first protrusion of the fastener engages with the second angled surface of the first locking feature of the projection to rotate the fastener with respect to the nut in response to a downward force on the fastener, and wherein in a second state of engagement of the fastener with the nut, a portion of the first engagement surface of the first protrusion is engaged with the first locking surface of the first locking feature to maintain a positioning of the fastener with respect to the nut.

In the following description, details are set forth by way of example to facilitate discussion of the disclosed subject matter. It should be apparent to a person of ordinary skill in the field, however, that the disclosed embodiments are exemplary and not exhaustive of all possible embodiments.

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a personal computer, a PDA, a consumer electronic device, a network storage device, or another suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include an instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory (SSD); as well as communications media such wires, optical fibers, microwaves, radio waves, and other electromagnetic and/or optical carriers; and/or any combination of the foregoing.

Particular embodiments are best understood by reference to FIGS. 1-14 wherein like numbers are used to indicate like and corresponding parts.

Turning now to the drawings, FIG. 1 illustrates a block diagram depicting selected elements of an information handling system 100 in accordance with some embodiments of the present disclosure. In various embodiments, information handling system 100 may represent different types of portable information handling systems, such as, display devices, head mounted displays, head mount display systems, smart phones, tablet computers, notebook computers, media players, digital cameras, 2-in-1 tablet-laptop combination computers, and wireless organizers, or other types of portable information handling systems. In one or more embodiments, information handling system 100 may also represent other types of information handling systems, including desktop computers, server systems, controllers, and microcontroller units, among other types of information handling systems. Components of information handling system 100 may include, but are not limited to, a processor subsystem 120, which may comprise one or more processors, and system bus 121 that communicatively couples various system components to processor subsystem 120 including, for example, a memory subsystem 130, an I/O subsystem 140, a local storage resource 150, and a network interface 160. System bus 121 may represent a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus.

As depicted in FIG. 1, processor subsystem 120 may comprise a system, device, or apparatus operable to interpret and/or execute program instructions and/or process data, and may include a microprocessor, microcontroller, digital signal processor (DSP), application specific integrated circuit (ASIC), or another digital or analog circuitry configured to interpret and/or execute program instructions and/or process data. In some embodiments, processor subsystem 120 may interpret and/or execute program instructions and/or process data stored locally (e.g., in memory subsystem 130 and/or another component of information handling system). In the same or alternative embodiments, processor subsystem 120 may interpret and/or execute program instructions and/or process data stored remotely (e.g., in network storage resource 170).

Also in FIG. 1, memory subsystem 130 may comprise a system, device, or apparatus operable to retain and/or retrieve program instructions and/or data for a period of time (e.g., computer-readable media). Memory subsystem 130 may comprise random access memory (RAM), electrically erasable programmable read-only memory (EEPROM), a PCMCIA card, flash memory, magnetic storage, opto-magnetic storage, and/or a suitable selection and/or array of volatile or non-volatile memory that retains data after power to its associated information handling system, such as system 100, is powered down.

In information handling system 100, I/O subsystem 140 may comprise a system, device, or apparatus generally operable to receive and/or transmit data to/from/within information handling system 100. I/O subsystem 140 may represent, for example, a variety of communication interfaces, graphics interfaces, video interfaces, user input interfaces, and/or peripheral interfaces. In various embodiments, I/O subsystem 140 may be used to support various peripheral devices, such as a touch panel, a display adapter, a keyboard, an accelerometer, a touch pad, a gyroscope, an IR sensor, a microphone, a sensor, or a camera, or another type of peripheral device.

Local storage resource 150 may comprise computer-readable media (e.g., hard disk drive, floppy disk drive, CD-ROM, and/or other type of rotating storage media, flash memory, EEPROM, and/or another type of solid state storage media) and may be generally operable to store instructions and/or data. Likewise, the network storage resource may comprise computer-readable media (e.g., hard disk drive, floppy disk drive, CD-ROM, and/or other type of rotating storage media, flash memory, EEPROM, and/or other type of solid state storage media) and may be generally operable to store instructions and/or data.

In FIG. 1, network interface 160 may be a suitable system, apparatus, or device operable to serve as an interface between information handling system 100 and a network 110. Network interface 160 may enable information handling system 100 to communicate over network 110 using a suitable transmission protocol and/or standard, including, but not limited to, transmission protocols and/or standards enumerated below with respect to the discussion of network 110. In some embodiments, network interface 160 may be communicatively coupled via network 110 to a network storage resource 170. Network 110 may be a public network or a private (e.g. corporate) network. The network may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or another appropriate architecture or system that facilitates the communication of signals, data and/or messages (generally referred to as data). Network interface 160 may enable wired and/or wireless communications (e.g., NFC or Bluetooth) to and/or from information handling system 100.

In particular embodiments, network 110 may include one or more routers for routing data between client information handling systems 100 and server information handling systems 100. A device (e.g., a client information handling system 100 or a server information handling system 100) on network 110 may be addressed by a corresponding network address including, for example, an Internet protocol (IP) address, an Internet name, a Windows Internet name service (WINS) name, a domain name or other system name. In particular embodiments, network 110 may include one or more logical groupings of network devices such as, for example, one or more sites (e.g. customer sites) or subnets. As an example, a corporate network may include potentially thousands of offices or branches, each with its own subnet (or multiple subnets) having many devices. One or more client information handling systems 100 may communicate with one or more server information handling systems 100 via any suitable connection including, for example, a modem connection, a LAN connection including the Ethernet or a broadband WAN connection including DSL, Cable, Ti, T3, Fiber Optics, Wi-Fi, or a mobile network connection including GSM, GPRS, 3G, or WiMax.

Network 110 may transmit data using a desired storage and/or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), and/or any combination thereof. Network 110 and its various components may be implemented using hardware, software, or any combination thereof.

In short, a "self-locking" fastening apparatus can facilitate coupling of a computing module such as a heat sink to a printed circuit board of the information handling system 100. This "self-locking" fastening apparatus can minimize and/or prevent thermal module unbalance at the computing module, and minimize and/or prevent mis-alignment of the computing module with the printed circuit board.

Turning to FIG. 2, FIG. 2 illustrates an environment 200 including an information handling system 202. The information handling system 202 can include a printed circuit board 210, a heat sink 212 (or computing module 212), and a fastening system 214. In some examples, the information handling system 202 is similar to, or includes, the information handling system 100 of FIG. 1.

The fastening system 214 can include a fastener 220, a nut 222, a spring 224, and a washer 226. The fastener 220 can be removably coupled with (or removably engaged with) the nut 222, described further herein. The information handling system 202 can include multiple fastening systems 214 depending on the desired application, with each of the multiple fastening systems 214 including a corresponding fastener 220, nut 222, spring 224, and washer 226.

The fastener 220 can include a hollow shaft 250 and protrusions 252a, 252b (collectively referred to as protrusions 252).

The nut 222 can include a projection 228. The projection 228 can include locking features 260a, 260b (collectively referred to as locking features 260).

Figure 3:
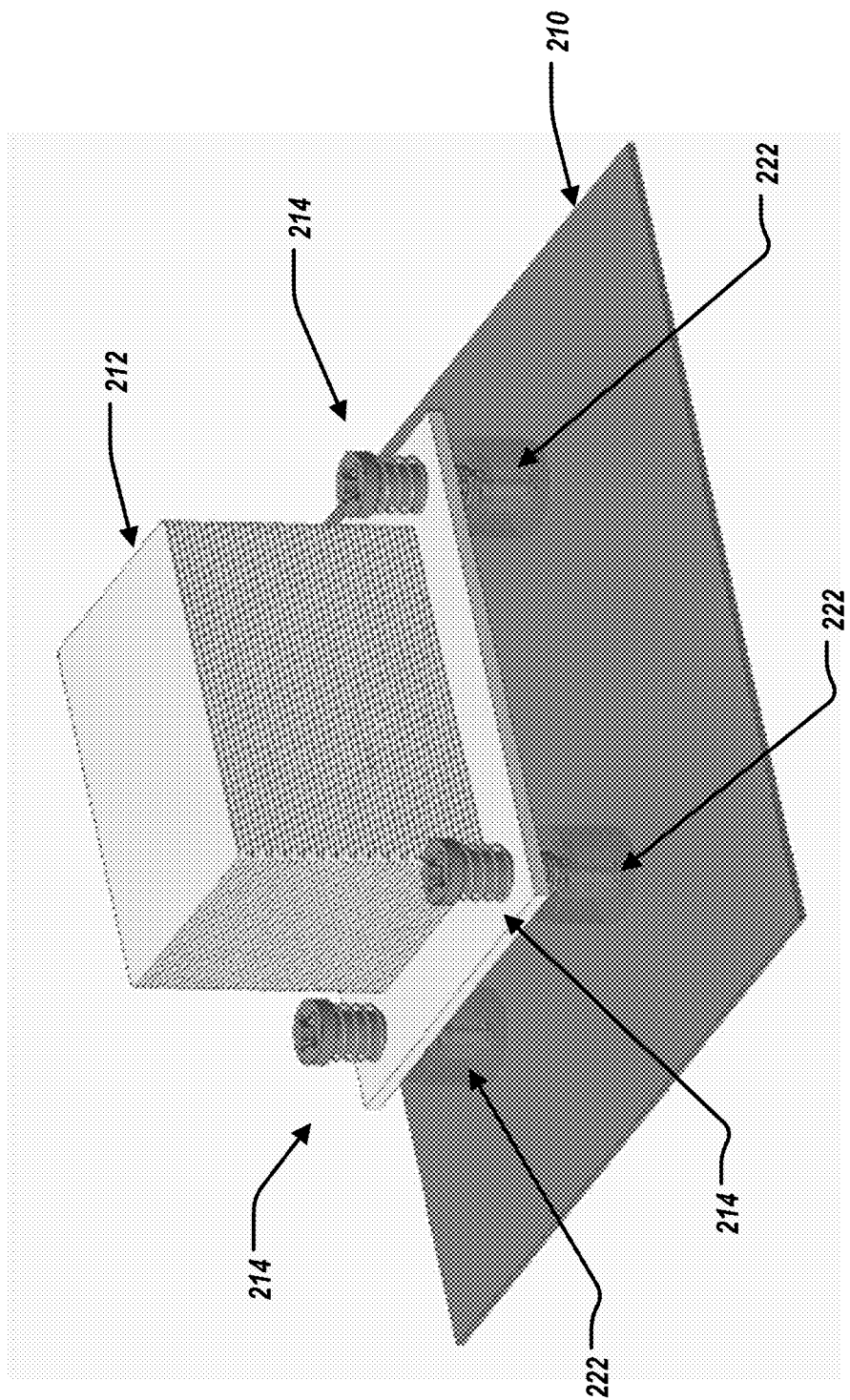
FIG. 3 illustrates a perspective view of the fastening system, a heat sink, and a circuit board.

FIG. 3 illustrates a perspective view of the fastening system 214, the heat sink 212, and the circuit board 210. In particular, a partial transparent view of the fastening system 214 is shown. The heat sink 212 can be coupled to the printed circuit board 210 using the fastening system 214. As illustrated, multiple fastening systems 214 can couple the heat sink 212 to the printed circuit board 210 (with three fastening systems 214 being illustrated). However, any number of fastening systems 214 can couple the heat sink 212 to the printed circuit board 210 (e.g., four fastening systems 214). In some examples, the nut 222 of each fastening system 214 is coupled to the printed circuit board 210. For example, the nut 222 can be coupled to the printed circuit board 210 via an adhesive.

Figure 4:
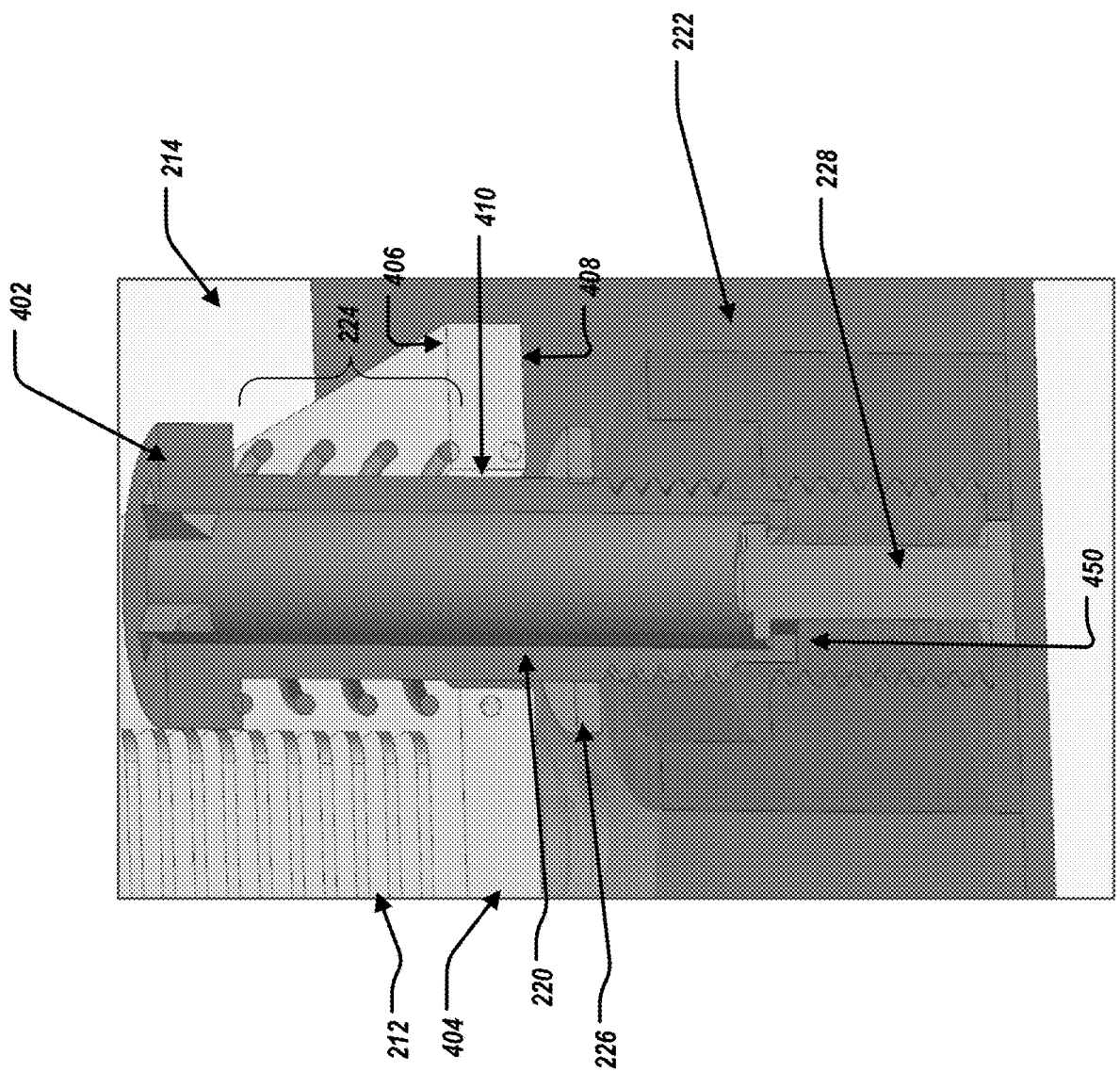
FIG. 4 illustrates a side cut-away view of the fastening system and the heat sink.

FIG. 4 illustrates a side cut-away view of the fastening system 214 and the heat sink 212. In particular, the fastener 220 can include a head 402. The heat sink 212 can include a plate 404. The plate 404 can include a first surface 406 and a second surface 408. The first surface 406 of the plate 404 is opposite to the second surface 408 of the plate 404. The heat sink 212, and in particular, the plate 404 of the heat sink 212, can include a through hole 410.

A portion of the fastener 220 can be positioned through (or within) the through hole 410 of the heat sink 212. When the fastener 220 is positioned though the through hole 410, the spring 224 is positioned between the first surface 406 of the plate 404 of the heat sink 212 and the head 402 of the fastener 220. Further, when the fastener 220 is positioned though the through hole 410, the washer 216 is positioned between the second surface 408 of the plate 404 of the heat sink 212 and the nut 222.

Figure 5B:
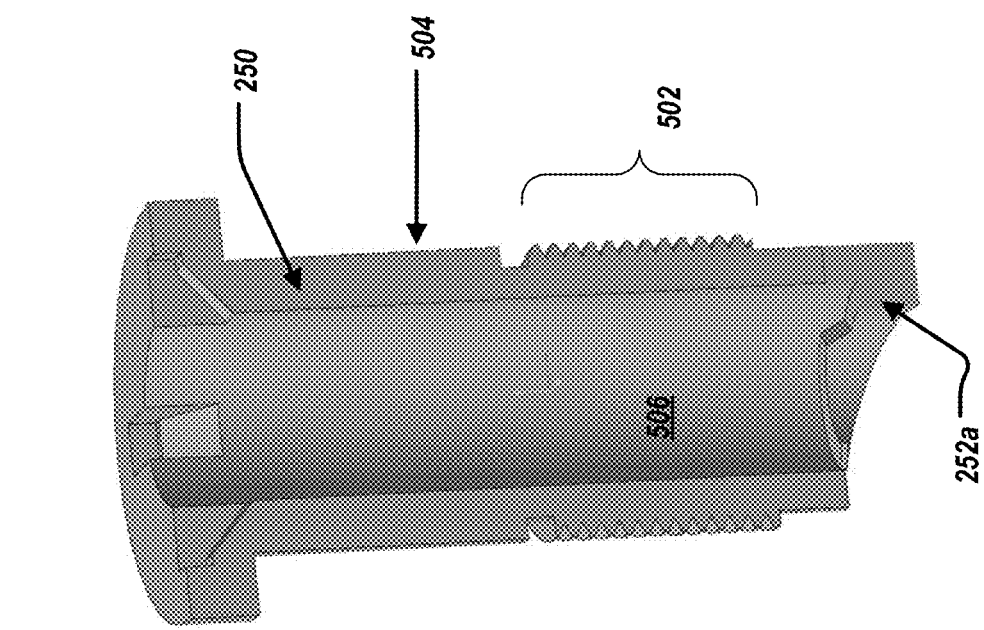
FIG. 5B illustrates a perspective cut-away view of a portion of the fastener
Figure 5A:
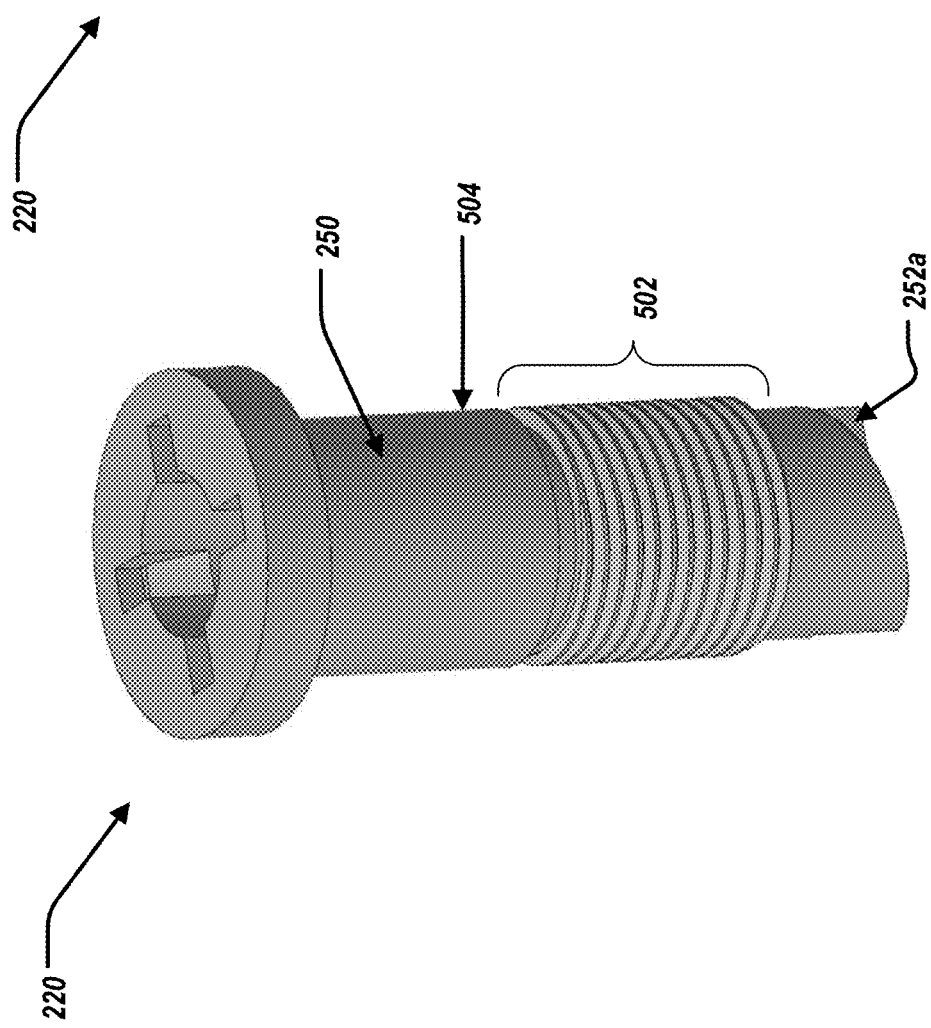
FIG. 5A illustrates a perspective view of a portion of the fastener.

FIG. 5A illustrates a perspective view of a portion of the fastener 220; and FIG. 5B illustrates a perspective cut-away view of a portion of the fastener 220. Referring to FIGS. 5A, 5B, the fastener 220 can include the hollow shaft 250 and a threaded portion 502 positioned on an outer surface 504 of the hollow shaft 250. The fastener 220 can include the protrusions 252a, 252b. The fastener 220 can include any number of protrusions 252. The protrusions 252 can extend from an inner surface 506 of the hollow shaft 250 of the fastener 220.

Figure 6A:
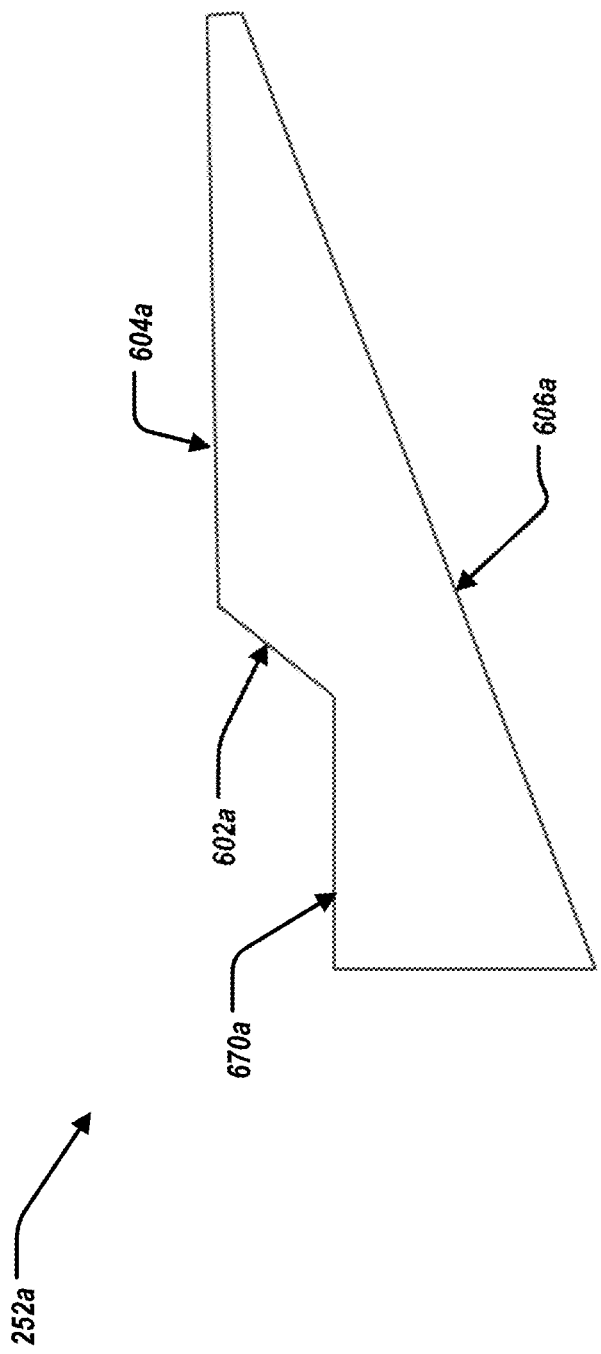
FIGS. 6A, 6B illustrate respective protrusions.
Figure 6B:
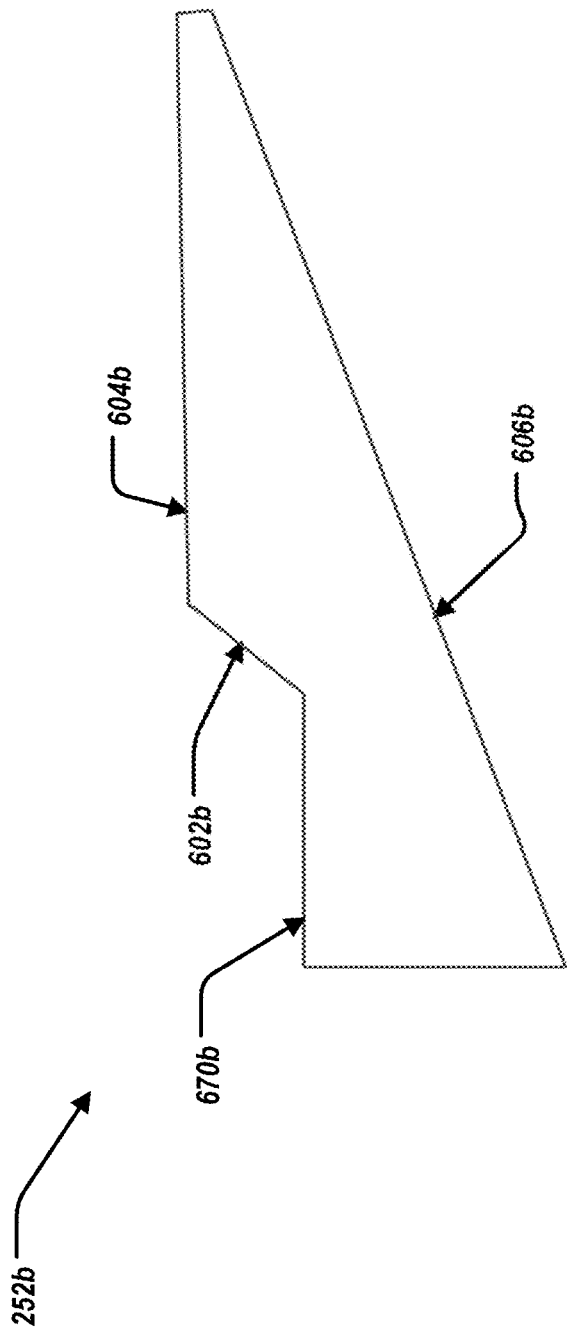

FIG. 6A illustrates the protrusion 252a. The protrusion 252a can include a first angled surface 602a, a first engagement surface 604a, a first sloped surface 606a, and a third engagement surface 670a. The first sloped surface 606a can be at a first end 450 (shown in FIG. 4) of the fastener 214. FIG. 6B illustrates the protrusion 252b. The protrusion 252b can include a second angled surface 602b, a second engagement surface 604b, a second sloped surface 606b, and a fourth engagement surface 670b. The second sloped surface 606b can be at the first end 450 (shown in FIG. 4) of the fastener 214. The angled surfaces 602a, 602b can collectively be referred to as angled surfaces 602. The engagement surfaces 604a, 604b can collectively be referred to as engagement surfaces 604. The sloped surfaces 606a, 606b can collectively be referred to as sloped surfaces 606.

Figure 7A:
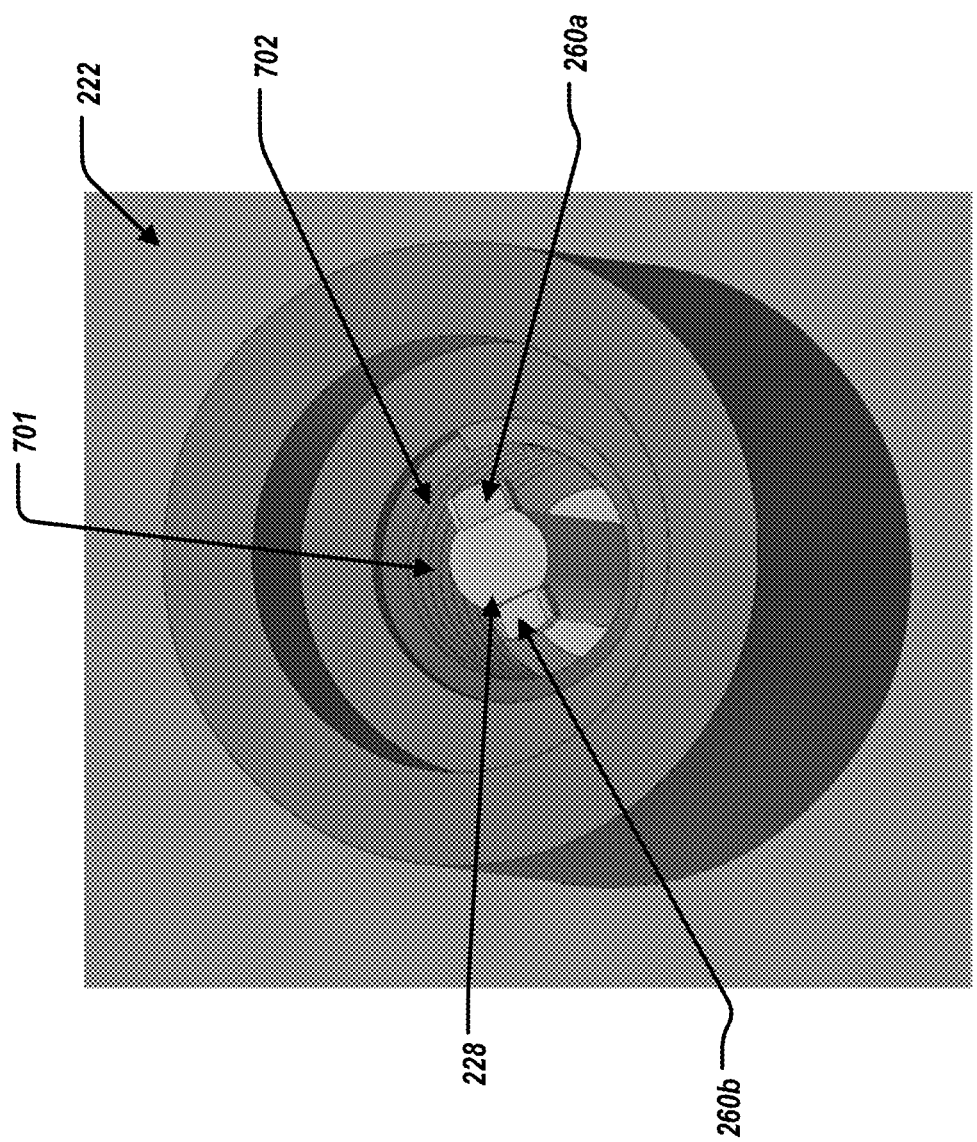
FIG. 7A illustrates a top down angled perspective of the nut.
Figure 7B:
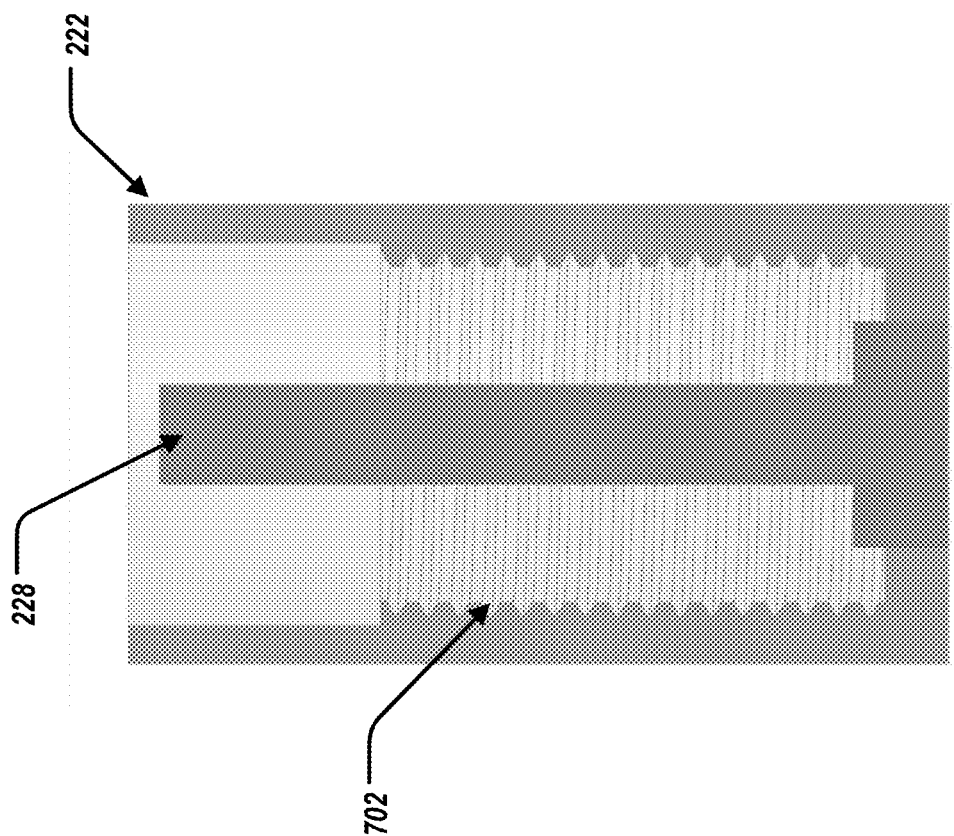
FIG. 7B illustrates cut-away side view of the nut.

FIG. 7A illustrates a top down angled perspective of the nut 222 that corresponds to the fastener 214; and FIG. 7B illustrates cut-away side view of the nut 222. Referring to FIGS. 7A, 7B, the nut 222 can include a cavity 701 having a threaded portion 702. The projection 228 is positioned within the cavity 701 of the nut 222.

Figure 8B:
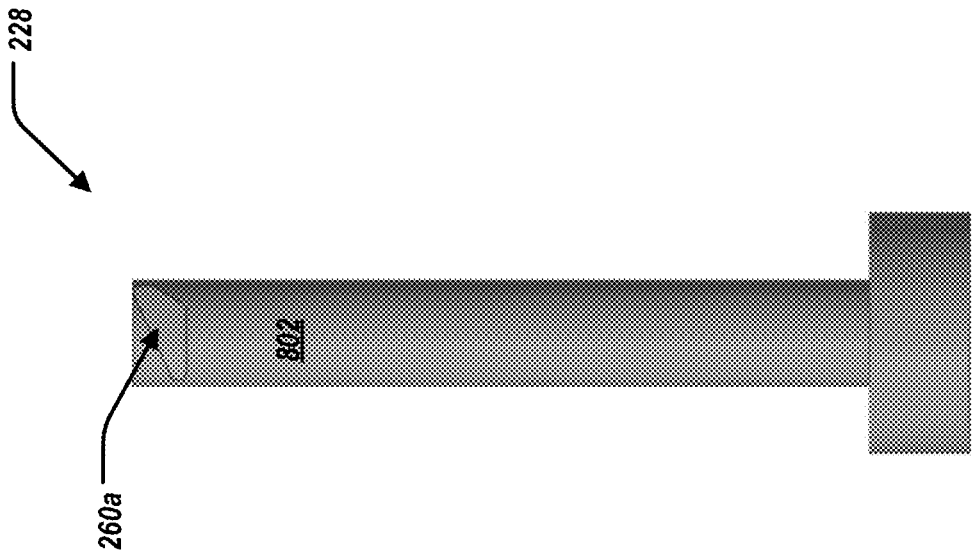
FIG. 8B illustrates a side view of the projection.
Figure 8A:
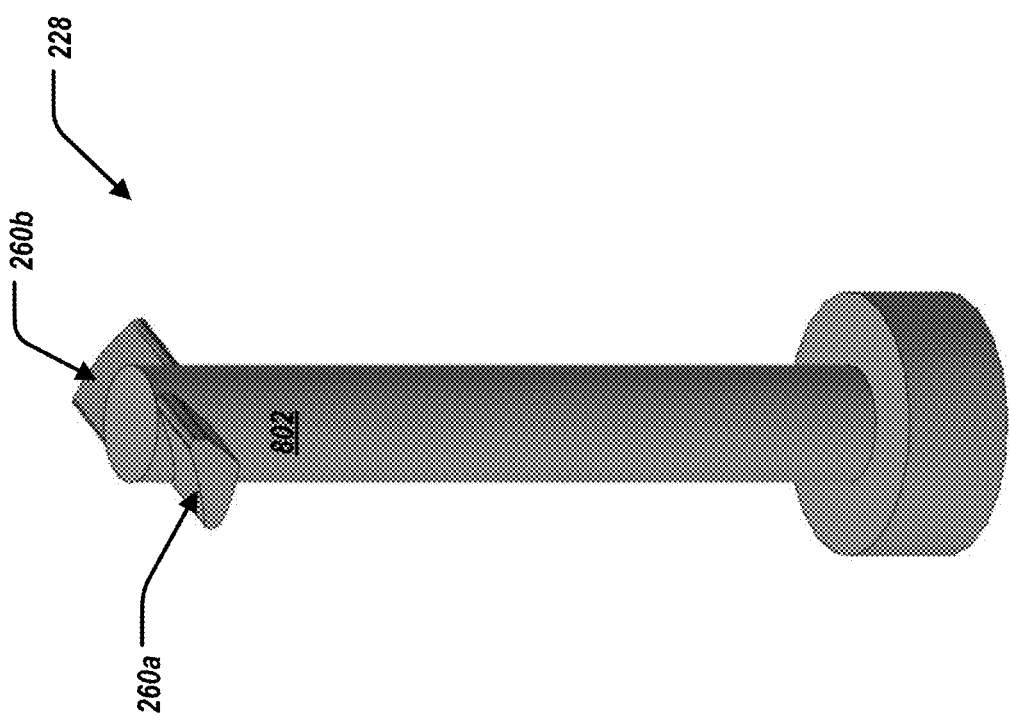
FIG. 8A illustrates a perspective view of the projection.

FIG. 8A illustrates a perspective view of the projection 228; and FIG. 8B illustrates a side view of the projection 228. The projection 228 includes the locking features 260a, 260b. The projection 228 can include any number of locking features 260. The locking features 260 are positioned on an outer surface 802 of the projection 228. In some examples, the number of locking features 260 of the projection 228 correspond to the number of protrusions 252 of the fastener 220. In some examples, the number of locking features 260 of the projection 228 is the same as the number of protrusions 252 of the fastener 220.

FIG. 9A illustrates the first locking feature 260a. The first locking feature 260a can include a third angled surface 902a, a first locking surface 904a, and a fourth angled surface 906a. FIG. 9B illustrates the second locking feature 260b. The second locking feature 260b can include a fifth angled surface 902b, a second locking surface 904b, and a sixth angled surface 906b. The angled surfaces 902a, 902b can collectively be referred to as angled surfaces 902. The locking surfaces 904a, 904b can collectively be referred to as locking surfaces 904. The angled surfaces 906a, 906b can collectively be referred to as angled surfaces 906. In some examples, a slope of the angled surface 602 of the protrusion 252 corresponds to a slope of the angled surface 902 of the locking feature 260. In some examples, a slope of the angled surface 602 of the protrusion 252 is complementary to a slope of the angled surface 902 of the locking feature 260.

Figure 10:
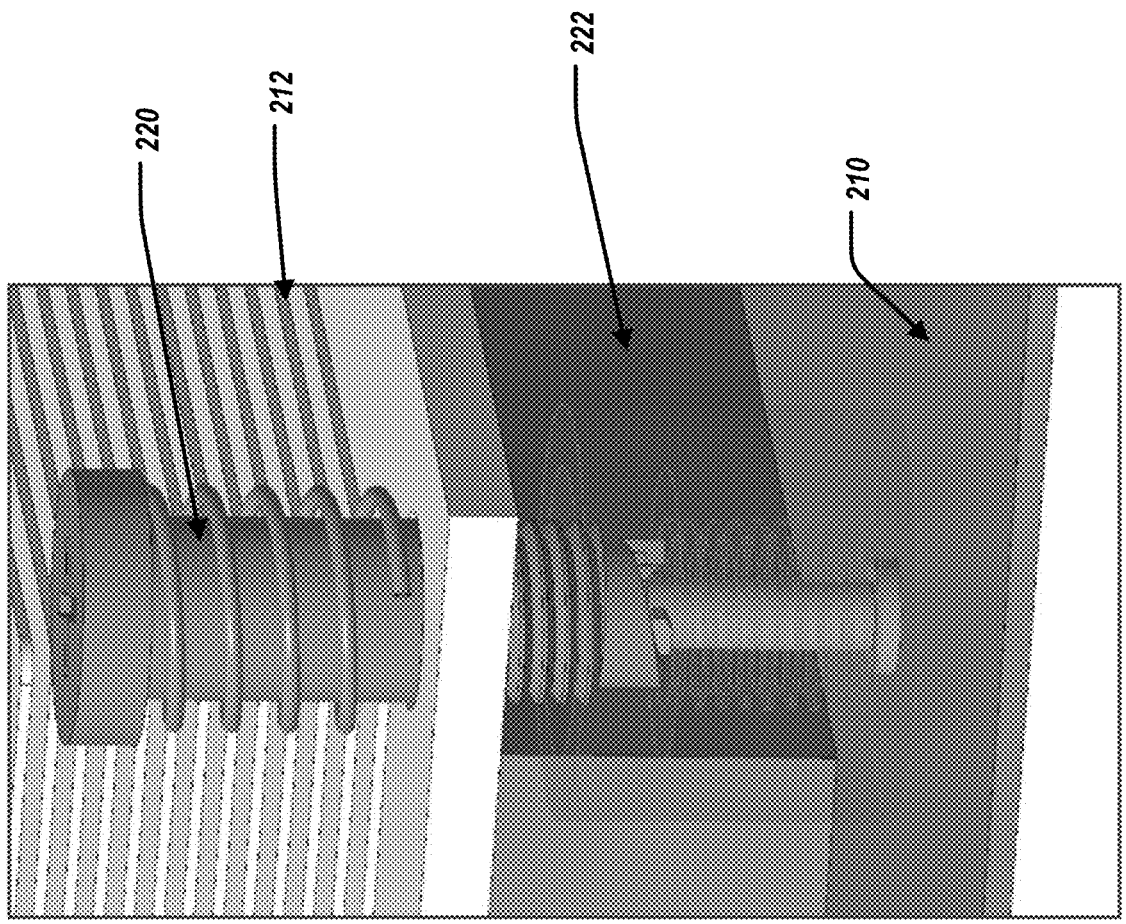
FIG. 10 illustrates a perspective view of the fastener coupling the heat sink to the printed circuit board by engagement with the nut.

FIG. 10 illustrates a perspective view of the fastener 220 coupling the heat sink 212 to the printed circuit board 210 by engagement with the nut 222.

FIG. 11 illustrates a perspective view of the fastener 220 coupling the heat sink 212 to the printed circuit board 210 by engagement with the nut 222 and the projection 228, in a first state. Specifically, FIG. 11 illustrates a first state of engagement of the fastener 220 with the nut 222.

Figure 12A:
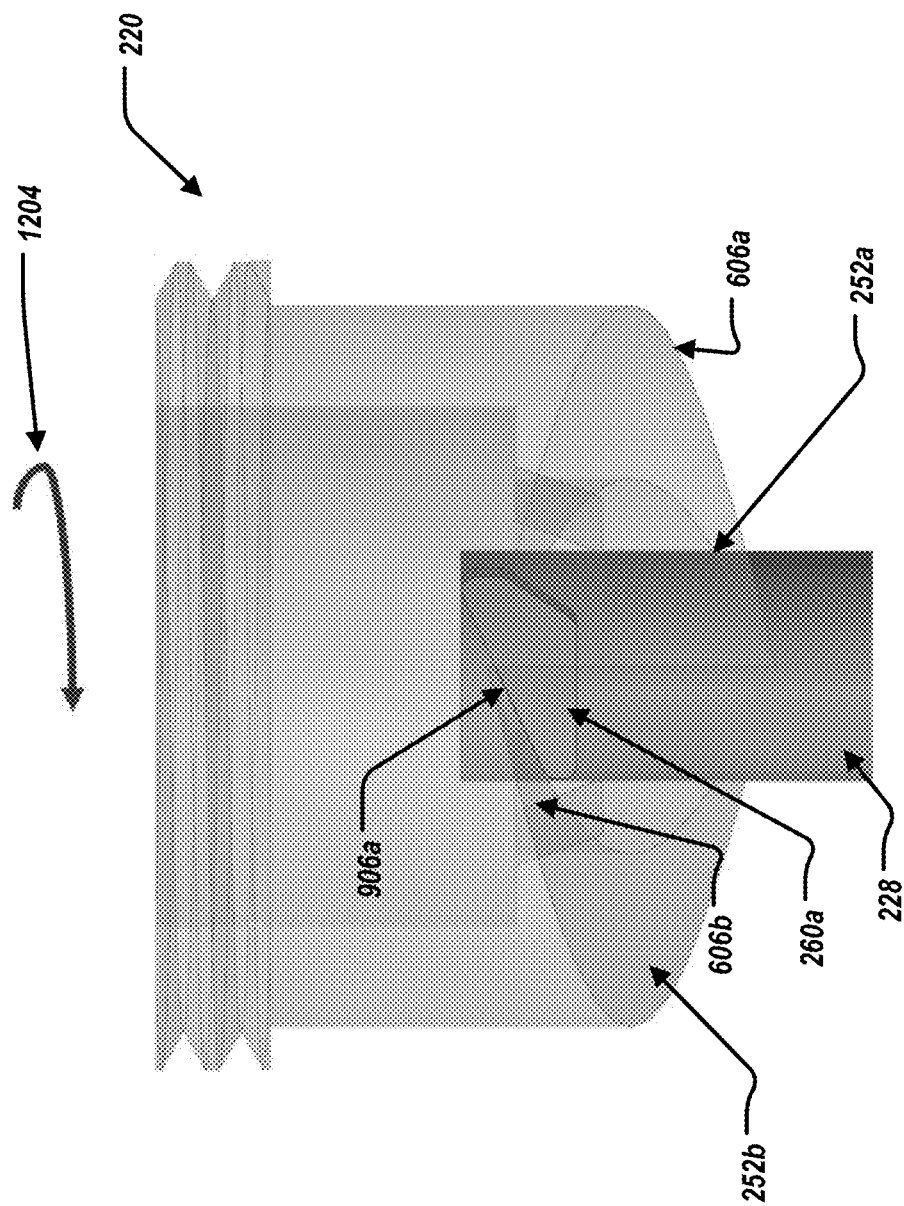
FIG. 12A illustrates the fastener entering the first state of engagement with respect to the nut.
Figure 12B:
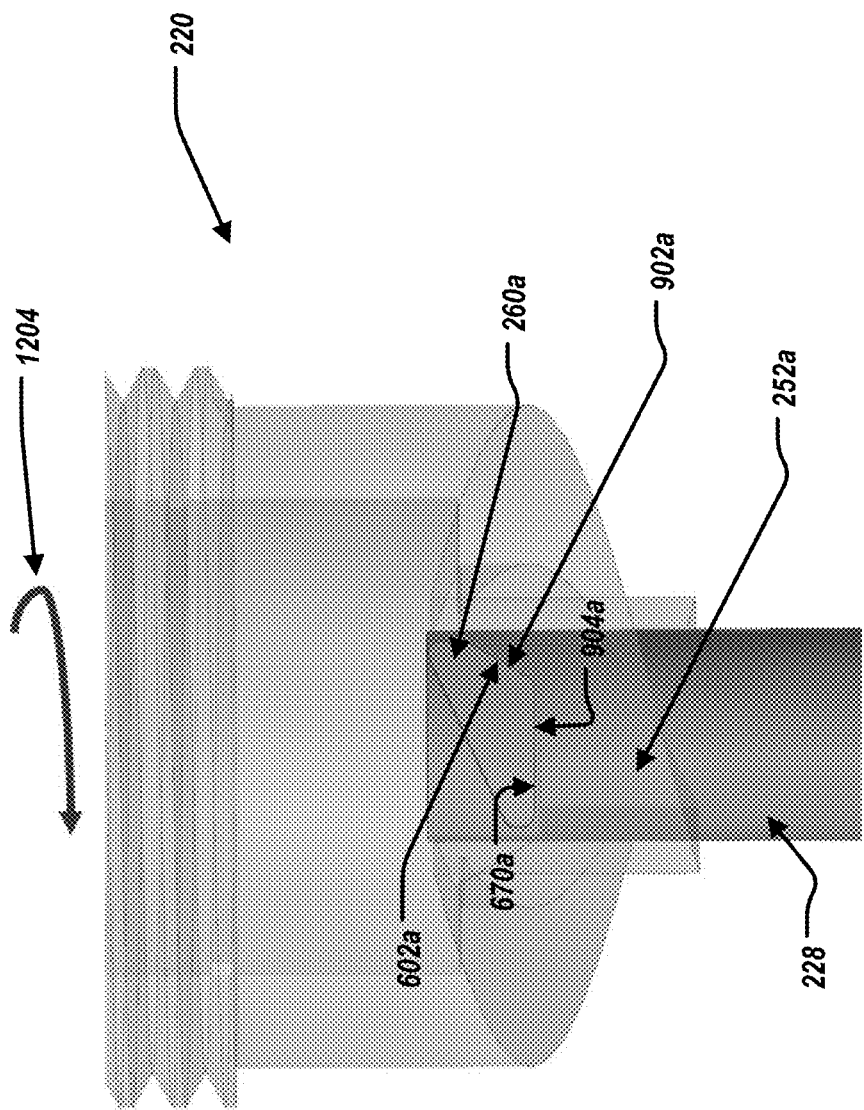
FIG. 12B illustrates the first state of engagement of the fastener with respect to the nut.

FIG. 12A illustrates the fastener 220 entering the first state of engagement with the nut 222; and FIG. 12B illustrates the first state of engagement of the fastener 220 with respect to the nut 222, and in particular, engagement with the projection 228 of the nut 222.

With respect to FIG. 12A, the second sloped surface 606b of the protrusion 252b of the fastener 220 engages with the fourth angled surface 906a of the first locking feature 260a. When the second sloped surface 606b of the protrusion 252b of the fastener 220 engages with the fourth angled surface 906a of the first locking feature 260a, the fastener 220 is rotated with respect to the nut 222 in response to the downward force 1102 on the fastener 220. Similarly, the first sloped surface 606a of the protrusion 252a of the fastener 220 engages with the sixth angled surface 906b of the second locking feature 260b (not shown). When the first sloped surface 606a of the protrusion 252a of the fastener 220 engages with the sixth angled surface 906b of the second locking feature 260b (not shown), the fastener 220 is rotated with respect to the nut 222 in response to the downward force 1102 on the fastener 220.

With respect to FIG. 12B, in particular, in the first state of engagement, the first angled surface 602a of the protrusion 252a engages with the third angled surface 902a of the locking feature 260a. Further, the third engagement surface 670a of the protrusion 252b of the fastener 220 engages with the first locking surface 904a of the first locking feature 260a Similarly, the second angled surface 602b of the protrusion 252b engages with the fifth angled surface 902b of the locking feature 260b (not shown); and the fourth engagement surface 670b of the protrusion 252b of the fastener 220 engages with the second locking feature 904b of the second locking feature 260a (not shown). When the first angled surface 602a of the protrusion 252a engages with the third angled surface 902a of the locking feature 260a and the second angled surface 602b of the protrusion 252b engages with the fifth angled surface 902b of the locking feature 260b (not shown), the fastener 220 is rotated with respect to the nut 222 in response to a downward force 1102 (shown in FIG. 11) on the fastener 220. Specifically, the downward force 1102 can be applied to the fastener 220 (e.g., by a user). In response to such downward force 1102, when the fastener 222 is in a first state of engagement with the nut 222 (when the first angled surface 602a of the protrusion 252a engages with the third angled surface 902a of the locking feature 260a and the second angled surface 602b of the protrusion 252b engages with the fifth angled surface 902b of the locking feature 260b (not shown)), the fastener 222 rotates with respect to the nut 222 indicated by rotational direction 1204.

Figure 13:
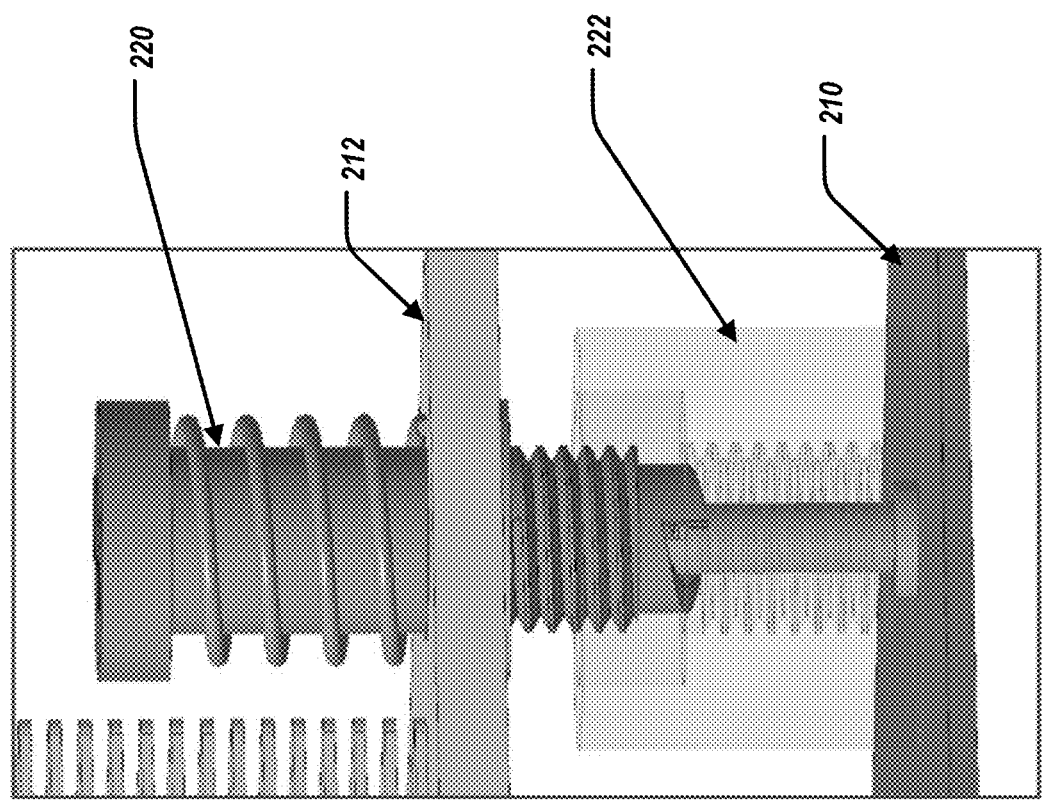
FIG. 13 illustrates a perspective view of the fastener coupling the heat sink to the printed circuit board by engagement with the nut, in a second state.

FIG. 13 illustrates a perspective view of the fastener 220 coupling the heat sink 212 to the printed circuit board 210 by engagement with the nut 222, in a second state. Specifically, FIG. 13 illustrates a second state of engagement of the fastener 220 with the nut 222.

FIG. 14A illustrates a side view of the second state of engagement of the fastener 220 with respect to the nut 222 (with the nut 222 shown as partially transparent); and FIG. 14B illustrates a side view of the second state of engagement of the fastener 220 with respect to the projection 228 (with the nut 222 removed from illustration for ease of illustration). Referring to FIGS. 14A, 14B, in particular, in the second state of engagement, the first engagement surface 604a of the protrusion 252a engages with the first locking surface 904a of the locking feature 260a. Similarly, the second engagement surface 604b of the protrusion 252b engages with the second locking surface 904b of the locking feature 260b (not shown). When the fastener 220 is rotated with respect to the nut 222 along the rotational direction 1204 (shown in FIGS. 12A, 12B), the protrusion 252 of the fastener 220 can ultimately become engaged with the locking feature 260 of the projection 228. Specifically, in the second state of engagement, the first engagement surface 604a of the protrusion 252a engages with the first locking surface 904a of the locking feature 260a and the second engagement surface 604b of the protrusion 252b engages with the second locking surface 904b of the locking feature 260b to maintain the positioning of the fastener 220 with respect to the nut 222. In some examples, when the protrusion 252 of the fastener 220 becomes engaged with the locking feature 260 of the projection 228 in the second state of engagement, the fastening system 214 couples the heat sink 212 to the circuit board 210.

Referring to FIGS. 5, 13, and 14, the spring 224 exerts a force against the head 402 of the fastener 220 such that the engagement surface 604 of the protrusion 252 engages with the locking surface 904 of the locking feature 260 to maintain the positioning of the fastener 220 with respect to the nut 222.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated other-wise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, features, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. A fastening system, including:
   a fastener including:
      a hollow shaft;
      a threaded portion positioned on an outer surface of the hollow shaft;
      a first protrusion extending from an inner surface of the hollow shaft, the first protrusion including:
         a first angled surface; and
         a first engagement surface;
   a nut corresponding to the fastener, including:
      a cavity having a threaded portion;
      a projection positioned within the cavity of the nut, the projection including:
         a first locking feature positioned on an outer surface of the projection, the first locking feature including:
            a second angled surface; and
            a first locking surface;
   wherein, in a first state of engagement of the fastener with the nut, the first angled surface of the first protrusion of the fastener engages with the second angled surface of the first locking feature of the projection to rotate the fastener with respect to the nut in response to a downward force on the fastener, and
   wherein in a second state of engagement of the fastener with the nut, a portion of the first engagement surface of the first protrusion is engaged with the first locking surface of the first locking feature to maintain a positioning of the fastener with respect to the nut.

2. The fastening system of claim 1, the projection further including:
- a second locking feature positioned on the outer surface of the projection, the second locking feature including:
  - a third angled surface; and
  - a second locking surface.

3. The fastening system of claim 2, the fastener further including:
- a second protrusion positioned on the inner surface of the hollow shaft, the second protrusion including:
  - a fourth angled surface; and
  - a second engagement surface.

4. The fastening system of claim 3,
- wherein, in the first state of engagement of the fastener with the nut, the fourth angled surface of the second protrusion of the fastener engages with the third angled surface of the second locking feature to rotate the fastener with respect to the nut in response to a downward force on the fastener,
- wherein in the second state of engagement of the fastener with the nut, a portion of the second engagement surface of the second protrusion is engaged with the second locking surface of the second locking feature to maintain the positioning of the fastener with respect to the nut.

5. The fastening system of claim 3, wherein the fastener further includes a first sloped surface and a second sloped surface at a first end of the fastener.

6. The fastening system of claim 5, wherein the first locking feature further includes a fifth angled surface and the second locking feature further includes a sixth angled surface.

7. The fastening system of claim 6,
- wherein, in the first state of engagement of the fastener with the nut, the fifth angled surface of the first locking feature engages with the second sloped surface of the fastener to rotate the fastener with respect to the nut in response to the downward force on the fastener,
- wherein, in the first state of engagement of the fastener with the nut, the sixth angled surface of the second locking feature engages with the first sloped surface of the fastener to rotate the fastener with respect to the nut in response to the downward force on the fastener.

8. The fastening system of claim 1, wherein a first slope of the first angled surface corresponds to a second slope of the second angled surface.

9. The fastening system of claim 8, wherein the first slope is complementary to the second slope.

10. The fastening system of claim 1, further including a spring and a washer.

11. The fastening system of claim 10, wherein the fastener is positioned through a through hole of a computing module such that the spring is positioned between a first surface of the computing module and a head of the fastener and the washer is positioned between a second surface of the computing module and the nut, the first surface of the computing module plate opposite to the second surface of the computing module.

12. The fastening system of claim 11, wherein the nut is coupled to a printed circuit board (PCB).

13. The fastening system of claim 12, wherein when the fastening system is in the second state of engagement of the fastener with the nut, the fastening system couples the computing module to the PCB.

14. The fastening system of claim 13, wherein the computing module is a heat sink.

15. The fastening system of claim 10, wherein the spring exerts a force against the head of the fastener such that the portion of the first engagement surface is engaged with the second locking surface of the second locking feature to maintain the positioning of the fastener with respect to the nut.

16. An information handling system, including:
- a processor;
- memory media storing instructions executable by the processor to perform operations;
- a fastening system, including:
  - a fastener including:
    - a hollow shaft;
    - a threaded portion positioned on an outer surface of the hollow shaft;
    - a first protrusion extending from an inner surface of the hollow shaft, the first protrusion including:
      - a first angled surface; and
      - a first engagement surface;
  - a nut corresponding to the fastener, including:
    - a cavity having a threaded portion;
    - a projection positioned within the cavity of the nut, the projection including:
      - a first locking feature positioned on an outer surface of the projection, the first locking feature including:
        - a second angled surface; and
        - a first locking surface;
- wherein, in a first state of engagement of the fastener with the nut, the first angled surface of the first protrusion of the fastener engages with the second angled surface of the first locking feature of the projection to rotate the fastener with respect to the nut in response to a downward force on the fastener, and
- wherein in a second state of engagement of the fastener with the nut, a portion of the first engagement surface of the first protrusion is engaged with the first locking surface of the first locking feature to maintain a positioning of the fastener with respect to the nut.

17. The information handling system of claim 16, the projection further including:
- a second locking feature positioned on the outer surface of the projection, the second locking feature including:
  - a third angled surface; and
  - a second locking surface.

18. The information handling system of claim 17, the fastener further including:
- a second protrusion positioned on the inner surface of the hollow shaft, the second protrusion including:
  - a fourth angled surface; and
  - a second engagement surface.

19. The information handling system of claim 18,
- wherein, in the first state of engagement of the fastener with the nut, the fourth angled surface of the second protrusion of the fastener engages with the third angled surface of the second locking feature to rotate the fastener with respect to the nut in response to a downward force on the fastener,
- wherein in the second state of engagement of the fastener with the nut, a portion of the second engagement surface of the second protrusion is engaged with the second locking surface of the second locking feature to maintain the positioning of the fastener with respect to the nut.

20. The information handling system of claim 19, wherein the fastener further includes a first sloped surface and a second sloped surface at a first end of the fastener.

\* \* \* \* \*